United States Patent
Egawa (10) Patent No.: US 7,413,925 B2
(45) Date of Patent: Aug. 19, 2008

(54) METHOD FOR FABRICATING SEMICONDUCTOR PACKAGE

(75) Inventor: Yoshimi Egawa, Tokyo (JP)

(73) Assignee: Oki Electric Inductry Co., Ltd., Tokyo (JP)

(*) Notice: Subject to any disclaimer, the term of this patent is extended or adjusted under 35 U.S.C. 154(b) by 4 days.

(21) Appl. No.: 11/593,039

(22) Filed: Nov. 6, 2006

(65) Prior Publication Data
US 2007/0184583 A1    Aug. 9, 2007

(30) Foreign Application Priority Data
Feb. 8, 2006    (JP) .............................. 2006-030407

(51) Int. Cl.
*H01L 21/50*  (2006.01)
*H01L 21/48*  (2006.01)
*H01L 21/44*  (2006.01)
*H01L 29/40*  (2006.01)

(52) U.S. Cl. ............... 438/106; 438/109; 438/113; 257/621

(58) Field of Classification Search ............... 438/106, 438/109, 113
See application file for complete search history.

(56) References Cited

U.S. PATENT DOCUMENTS

| | | | | |
|---|---|---|---|---|
| 6,608,371 B2 * | 8/2003 | Kurashima et al. | .......... | 257/686 |
| 6,614,104 B2 * | 9/2003 | Farnworth et al. | .......... | 257/686 |
| 6,953,748 B2 * | 10/2005 | Yamaguchi | .......... | 438/667 |
| 7,223,634 B2 * | 5/2007 | Yamaguchi | .......... | 438/108 |
| 2005/0046002 A1 * | 3/2005 | Lee et al. | .......... | 257/678 |

FOREIGN PATENT DOCUMENTS

JP    2005-236245    9/2005

* cited by examiner

*Primary Examiner*—Luan Thai
(74) *Attorney, Agent, or Firm*—Rabin & Berdo, PC (57) ABSTRACT

According to this invention, a method for fabricating a semiconductor package, in which a plurality of semiconductor chips having a through electrode is layered on a semiconductor interposer, comprising: mounting and layering a plurality of semiconductor chips on a first surface of a semiconductor wafer, which is to be used for a semiconductor interposer; forming a mold resin over the semiconductor chips to cover the semiconductor chips entirely; and dicing the semiconductor wafer to form a plurality of individual semiconductor packages.

6 Claims, 13 Drawing Sheets

METHOD FOR FABRICATING SEMICONDUCTOR PACKAGE

CROSS REFERENCE TO RELATED APPLICATION

This application claims the priority of Application No. 2006-30407, filed on Feb. 8, 2006 in Japan, the subject matter of which is incorporated herein by reference.

TECHNICAL FIELD OF THE INVENTION

This invention relates to a method for fabricating a semiconductor package, in which plural semiconductor chips having through electrodes are layered (superimposed) on a semiconductor interposer.

BACKGROUND OF THE INVENTION

In recent years, a system-in-package has been focused for semiconductor packaging technology. According to such a technology, plural semiconductor chips, each having an integrated circuit, are mounted at a high density to fabricate a high performance system for a short period of time. Especially, a system-in-package is required to be applied to a layered type of semiconductor package, in which plural semiconductor chips are layered in a three dimensional manner to minimize a size of the package. In response to such a demand, for example, Japanese patent publication No. 2005-236245A describes a semiconductor package, in which semiconductor chips, having through electrodes, are layered on a mounting chip, called "semiconductor interposer".

[Patent Related Publication] No. 2005-236245A

For fabricating a semiconductor package, according to a conventional method, a semiconductor interposer, which has been shaped to be thinner and diced into individual chips, is prepared; and a plurality of semiconductor chips is layered on it.

However, according to the above described conventional method, a thin and small piece of semiconductor interposer is hardly handled during packaging process, and therefore, it is difficult to improve work efficiency. As a result, semiconductor chips may easily have some damages and a yield rate may be lowered. Handling ability of a semiconductor interposer during packaging process could be improved by shaping the semiconductor interposer to have a larger thickness. However, a semiconductor package would have a larger thickness undesirably and it would become difficult to form through electrodes in the semiconductor interposer and difficult to fill material in the through holes.

OBJECTS OF THE INVENTION

Accordingly, an object of this invention is to provide a method for fabricating a semiconductor package, in which a handling ability of a semiconductor interposer can be improved and work efficiency can be improved as well.

Additional objects, advantages and novel features of this invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to this invention, a method for fabricating a semiconductor package, in which a plurality of semiconductor chips having a through electrode is layered on a semiconductor interposer, comprising: mounting and layering a plurality of semiconductor chips on a first surface of a semiconductor wafer, which is to be used for a semiconductor interposer; forming a mold resin over the semiconductor chips to cover the semiconductor chips entirely; and dicing the semiconductor wafer to form a plurality of individual semiconductor packages.

Preferably, a second surface of the semiconductor wafer, which is the opposite the first surface, is ground to shape the semiconductor wafer thinner after the mold resin is formed. After that, external terminals are formed on the second surface of the semiconductor wafer.

Preferably, a support member is adhered onto a second surface of the semiconductor wafer, which is the opposite the first surface, before mounting the semiconductor chips on the semiconductor wafer. The support member may be of a glass plate. Next, the first surface of the semiconductor wafer is ground after the support member is adhered to the second surface to shape the semiconductor wafer thinner. Subsequently, the semiconductor chips are mounted on the first surface of the semiconductor wafer, which has been ground to be thinner. After that, a rewiring layer may be formed on the first surface before the semiconductor chips are mounted on the semiconductor wafer.

Preferably, after the mold resin is formed, the support member is removed and external terminals are formed on the second surface of the semiconductor wafer. In another way, the external terminals may be formed on the second surface of the semiconductor wafer before the support member is adhered thereon.

ADVANTAGES OF THE INVENTION

According to this invention, a plurality of semiconductor chips is mounted on a semiconductor interposer in a wafer sate and the interposer is diced after resin-molding process, so that handling ability and work efficiency during packaging process is improved. In contrast, according to a conventional way, it was required to handle a small and thin piece of semiconductor interposer during packaging process.

Further, a semiconductor wafer is shaped or ground to be thinner after a resin molding process, so that handling ability during a grinding process would be improved.

When a support member is adhered onto a semiconductor wafer, a mechanical strength of the wafer would be increased, and therefore, handling ability of the wafer would be improved. The semiconductor wafer, adhered to such a support member, may be shaped to be thinner, so that wiring layers could be formed on both upper and lower surfaces of the semiconductor interposer.

When external terminals are formed on a surface of a semiconductor wafer before a support member is adhered thereto, the external terminals could be formed easily. The external terminals can be formed on a clean surface of the semiconductor wafer, having no adhesive on it.

DESCRIPTION OF THE REFERENCE NUMERALS

100: Semiconductor Chip
112: Silicon Wafer (Interposer)
114: Through Electrode
118, 217: Rewiring Layer
120: Layered Chips
124, 224: Molding Resin
215, 330: Adhesive
232, 332: Glass Plate
W: Si Wafer

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of this inventions. The following detailed description is, therefore, not to be taken in a limiting sense, and scope of this invention is defined only by the appended claims.

Figure 1A:
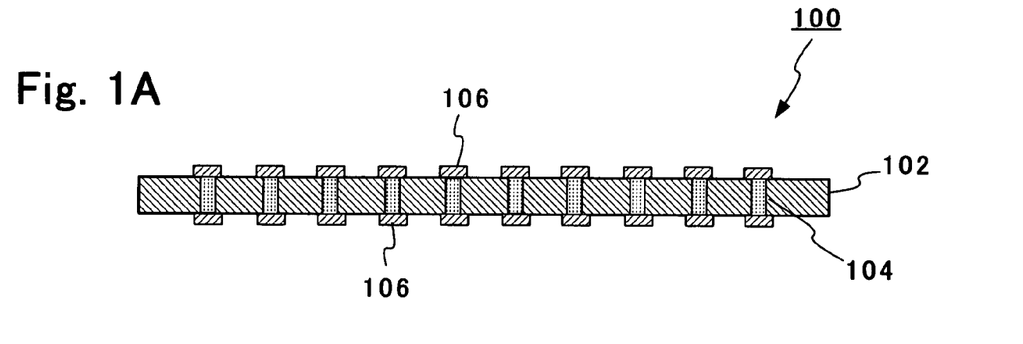
FIG. 1A is a cross-sectional view illustrating a semiconductor chip, which is applicable to a semiconductor package according to this invention.
Figure 1B:
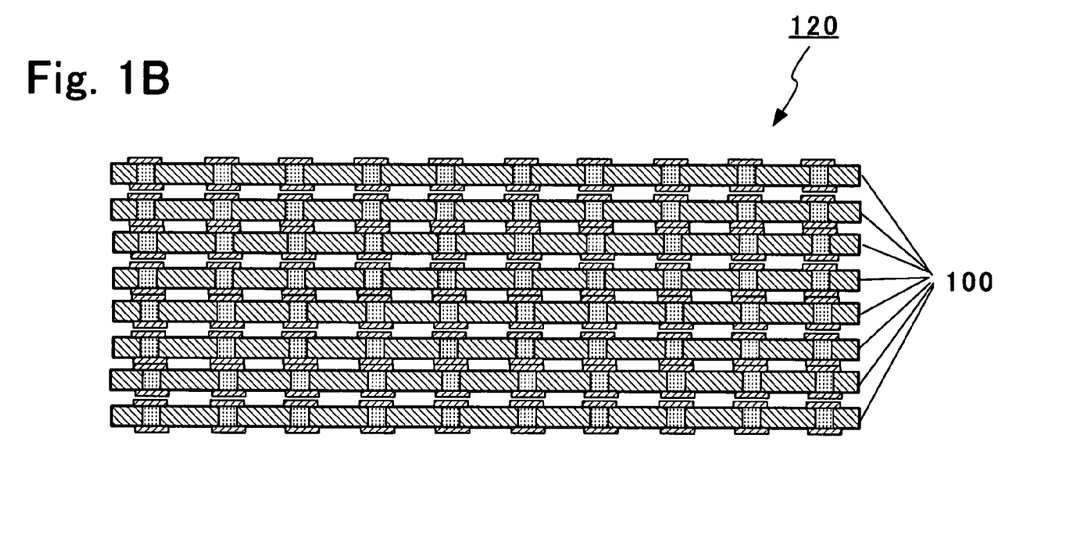
FIG. 1B is a cross-sectional view illustrating a layered structure of semiconductor chips, shown in FIG. 1A.
Figure 2:
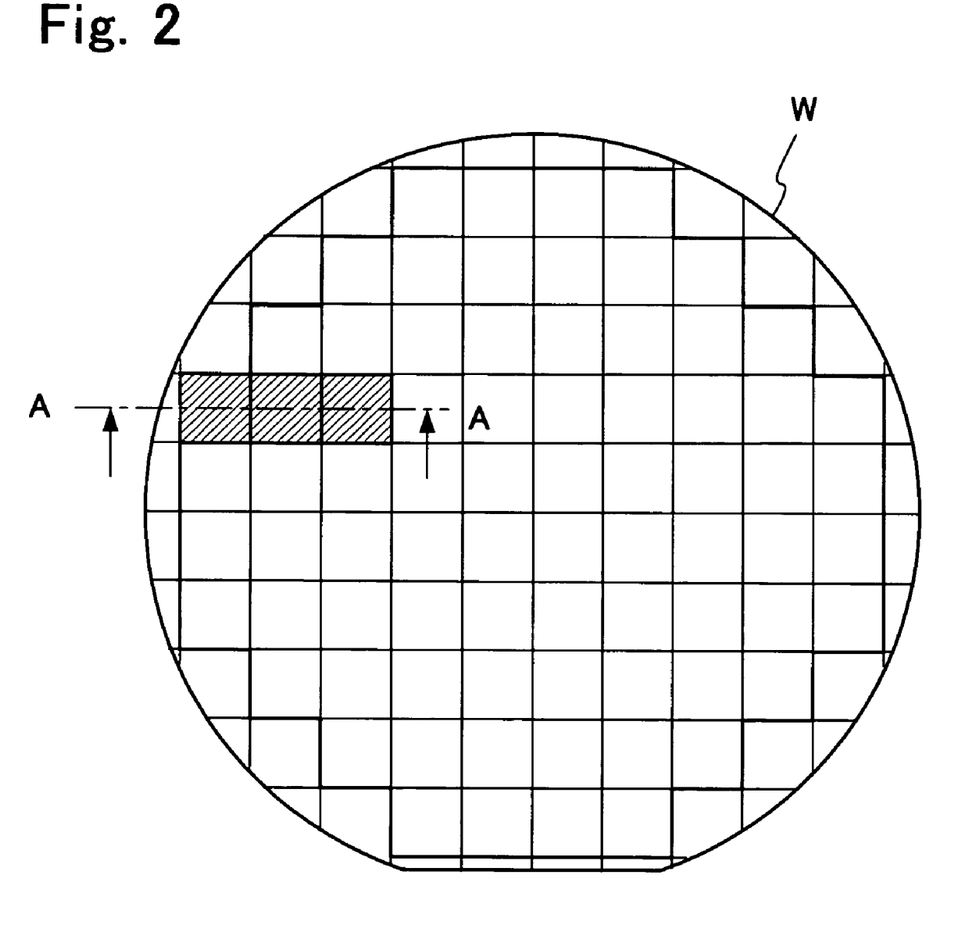
FIG. 2 is a plane view illustrating a silicon wafer for a semiconductor interposer, which is applicable to a semiconductor package according to this invention.

This invention is now described with preferred embodiments as follows: FIG. 1A is a cross-sectional view illustrating a semiconductor chip, which is applicable to a semiconductor package according to this invention. FIG. 1B is a cross-sectional view illustrating a layered structure of semiconductor chips, shown in FIG. 1A. FIG. 2 is a plane view illustrating a silicon wafer for a semiconductor interposer, which is applicable to a semiconductor package according to this invention.

A semiconductor chip 100 includes a semiconductor substrate 102, having through electrodes 104; and connection bumps 106, formed on both surfaces of the semiconductor substrate 102. The connection bumps 106 may be formed on only one of two surfaces of the semiconductor substrate 102. Preferably, the semiconductor substrate 102 has a thickness of 20-100 µm (micro meter) to secure an enough thickness for forming through electrodes 104. For easy understanding, it is assumed that a layered structure having a plurality of semiconductor chips 100, shown in FIG. 1B, is hereinafter called "chip-layered structure 120". The chip-layered structure 120 is mounted on a semiconductor interposer. According to this invention, semiconductor chips 100 are mounted on a semiconductor interposer, which is in a wafer state (condition).

Figure 3A:
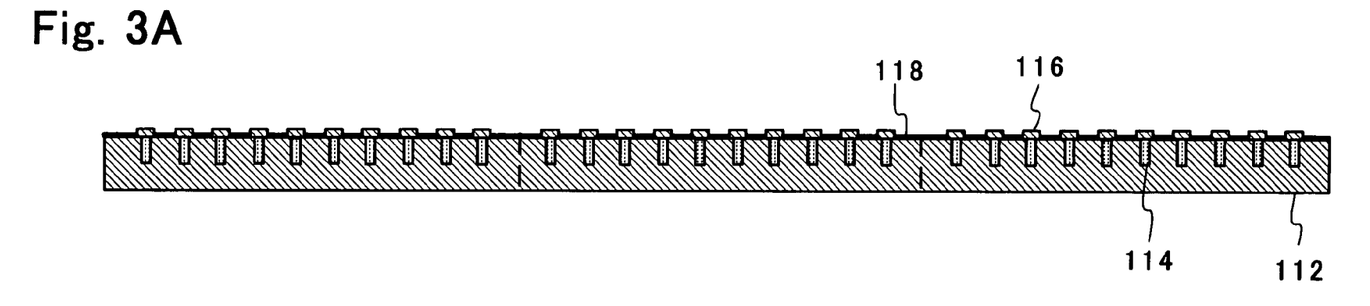
FIGS. 3A-3F are cross-sectional views showing fabricating steps of a semiconductor package according to a first preferred embodiment of this invention, each of which corresponds to a view taken on line A-A in FIG. 2.

FIGS. 3A-3F are cross-sectional views showing fabricating steps of a semiconductor package according to a first preferred embodiment of this invention, each of which corresponds to a view taken on line A-A in FIG. 2. Fist, as shown in FIG. 3A, a plurality of through electrodes 114 is formed in a silicon wafer 112, which is used for a semiconductor interposer. The silicon wafer 112 has a thickness of 500-1000 µm. Upper ends of the through electrodes 114 are exposed from an upper surface of the silicon wafer 112. A rewiring layer 118 is formed on the upper surface of the silicon wafer 112. Bumps 116 are formed on the upper ends of the through electrodes 114. An insulating layer, not shown, is formed over the rewiring layer 118 and the upper surface of the silicon wafer 112 except the exposed upper ends of the through electrodes 114. Each of the through electrodes 114 may be shaped to have a depth (length) of 20-100 µm.

In general, a semiconductor interposer is a thin member, which is arranged between a couple of layers, such as semiconductor chips, circuit boards and so on.

The bumps 106 and 116 may be made of a material, which can be applied to fusion bonding, for example, SnAg, SnPb, Cu+SnAg and Au+SnAg. The through electrodes 104 and 114 may be made of a material, for example, Cu, Al, W, Au, Ag and Poly-Si. The insulating layer may be made of a material, for example, SiO2, SiN and Polyimide.

Figure 3B:
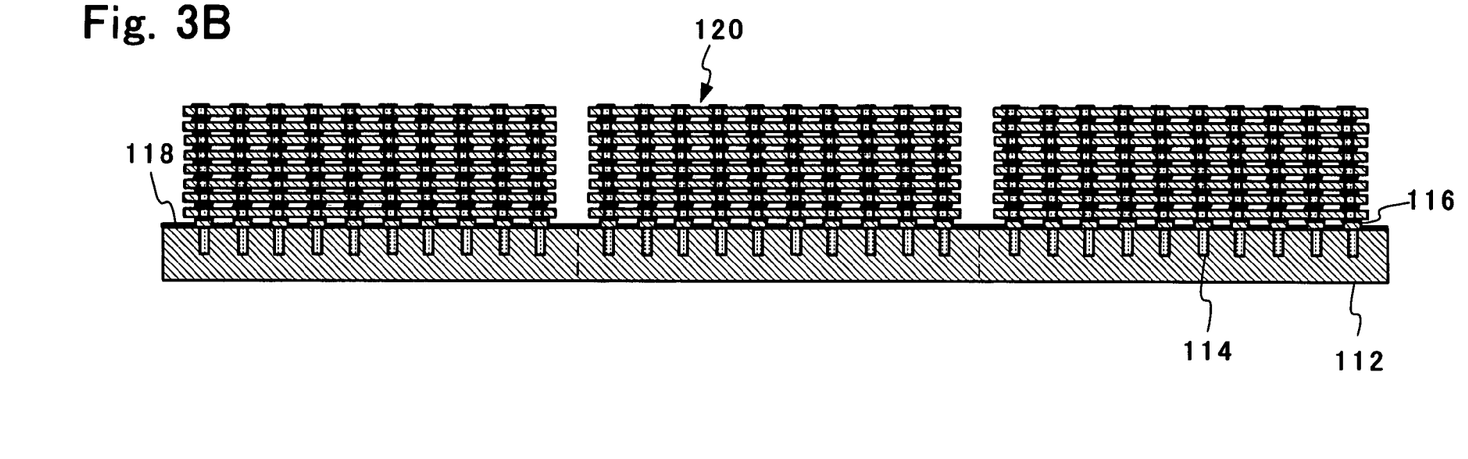

Next, as shown in FIG. 3B, semiconductor chips 100 are mounted on a specific area of the semiconductor wafer 112 to form a chip-layered structure 120. In the chip-layered structure 120, each of the semiconductor chips 100 is electrically connected to each other.

Figure 3C:
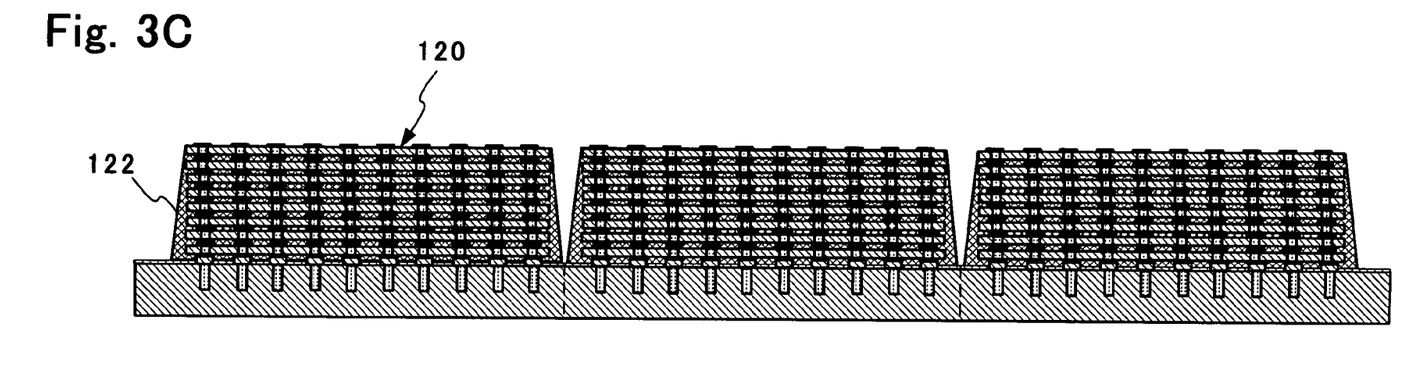

Next, as shown in FIG. 3C, an underfill resin 122 is injected from a side into the chip-layered structure 120, and is heated to be set. In another way, an underfill resin is provided at a predetermined area for chip mounting in advance before the semiconductor chip 100 is mounted. Such an underfill resin is temporarily harden when mounting each of the semiconductor chips 100. In other words, the semiconductor chips 100 are layered one-by-one to have an underfill resin between next two chips 100. The underfill resin may be of a thermosetting resin made from an epoxy material and silica (filler). In order to seal a narrow gap with the resin, a resin excluding a silica could be used.

Figure 3D:
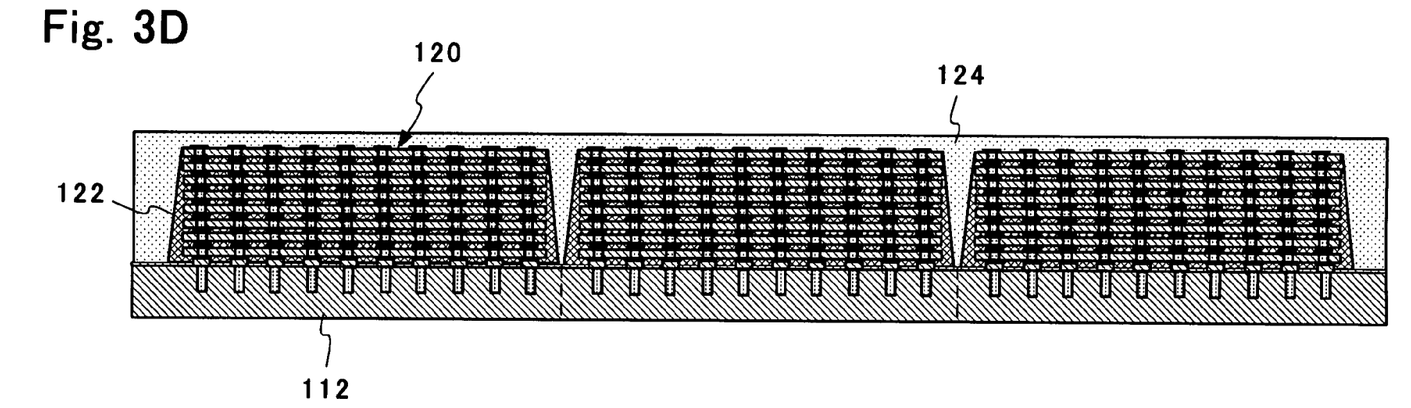

Next, as shown in FIG. 3D, a surface of the silicon wafer 112 is over-molded with a molding resin 124 entirely. Such an over-molding process is carried out by a transfer molding method using metal molds. The molding resin 124 may be made of an epoxy resin.

Figure 3E:
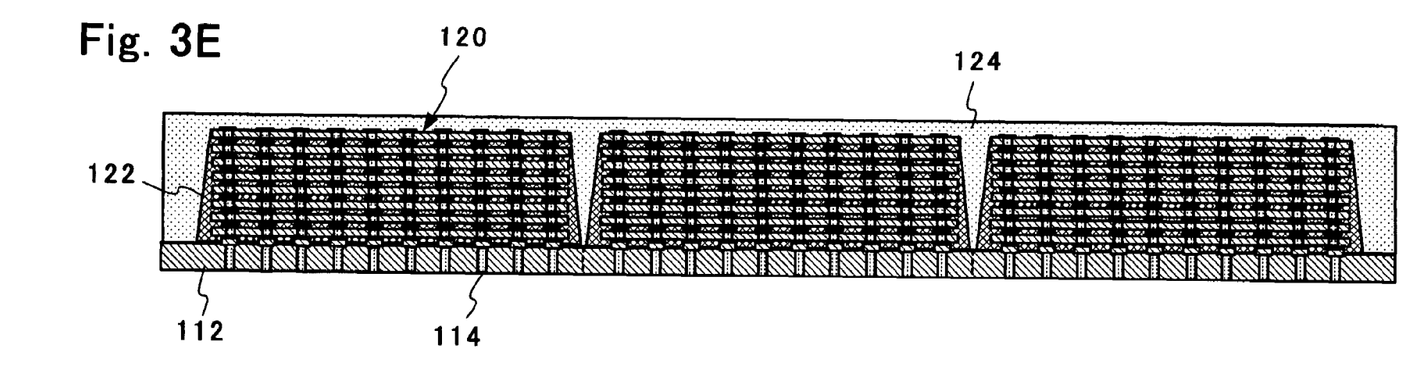
Figure 3F:
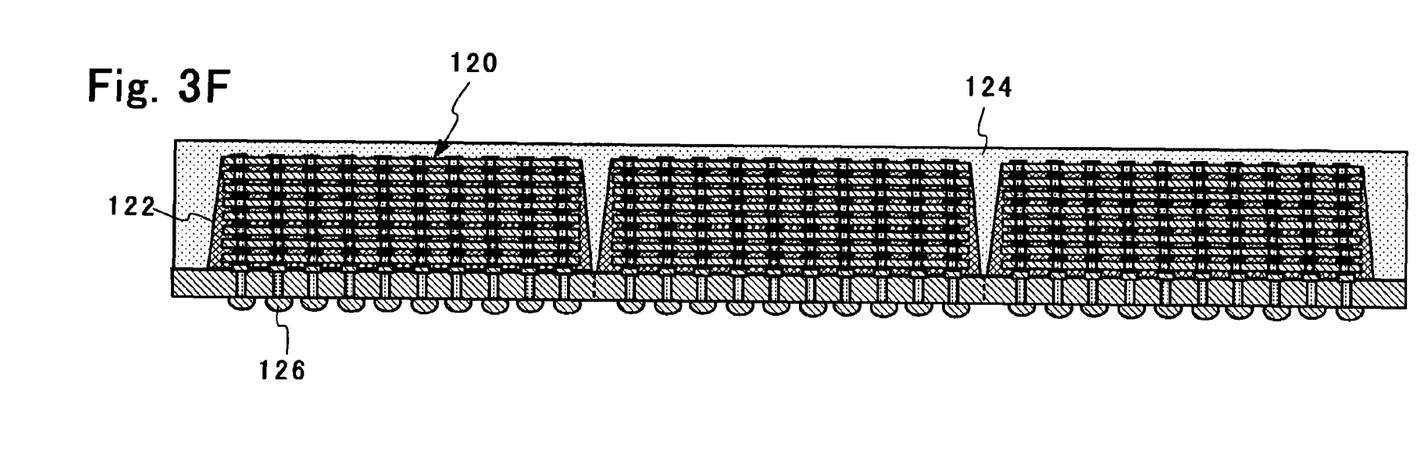

Next, as shown in FIG. 3E, a rear (lower) surface of the silicon wafer 112 is ground to make it thinner until lower ends of the through electrodes 114 are exposed. Subsequently, as shown in FIG. 3F, external terminals 126 are formed at predetermined locations on the rear surface of the silicon wafer 112. The external terminals 126 may be made of a material, for example, SnPb and SnAg. After that, the silicon wafer 112 is diced along dicing lines to form a plurality of individual semiconductor packages (BGA). The semiconductor package is mounted on a motherboard (circuit board).

As described above, according to the first preferred embodiment of this invention, semiconductor chips are mounted (layered) and resin-molded on a wafer state of semiconductor interposer, so that handling ability of the semiconductor interposer would be improved during fabrication processes. Further, the silicon wafer is shaped to be thinner after an over-molding process, so that the semiconductor interposer maintains a higher mechanical strength and defection due to lack of strength could be avoided.

FIGS. 4A-4I are cross-sectional views showing fabricating steps of a semiconductor package according to a second preferred embodiment of this invention, each of which corresponds to a view taken on line A-A in FIG. 2. In FIGS. 4A-4I, the same or corresponding components those in FIGS. 3A-3F are represented by the same reference numerals and the same description is not repeated.

Figure 4A:
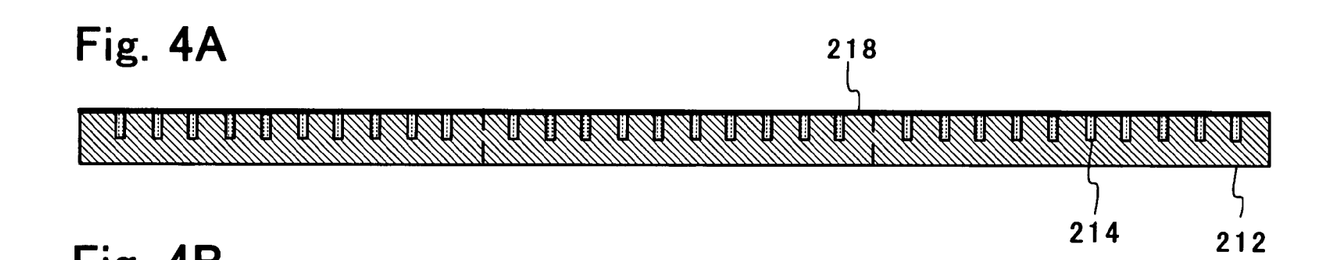
FIGS. 4A-4I are cross-sectional views showing fabricating steps of a semiconductor package according to a second preferred embodiment of this invention, each of which corresponds to a view taken on line A-A in FIG. 2.

Fist, as shown in FIG. 4A, a plurality of through electrodes 214 is formed in a silicon wafer 212 (W), which is used for a semiconductor interposer. The silicon wafer 212 has a thickness of 500-1000 µm. Upper ends of the through electrodes 214 are exposed from an upper surface of the silicon wafer 212. A rewiring layer 218 is formed on the upper surface of the silicon wafer 212. Bump pads are formed on the upper ends of the through electrodes 214. An insulating layer, not shown, is formed over the rewiring layer 218 and the upper surface of the silicon wafer 212. Each of the through electrodes 214 may be shaped to have a depth (length) of 20-100 µm.

The through electrodes 214 may be made of a material, for example, Cu, Al, W, Au, Ag and Poly-Si. The insulating layer may be made of a material, for example, SiO2, SiN and Polyimide.

Figure 4B:
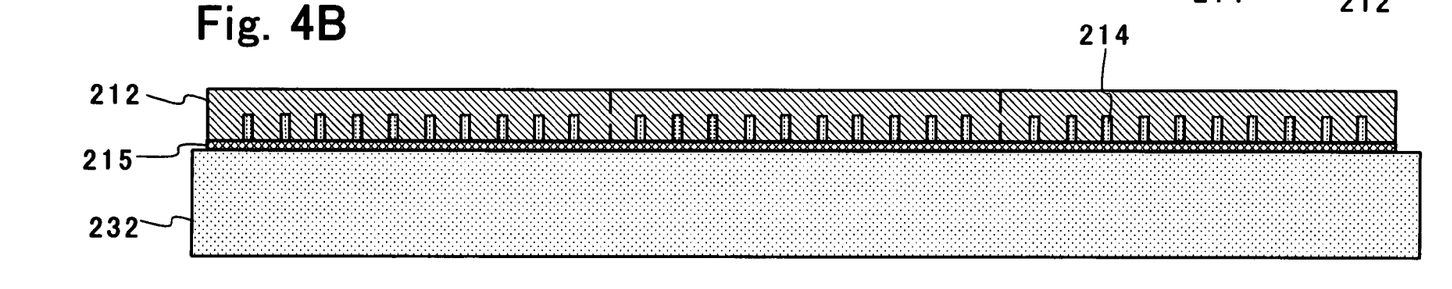

Next, as shown in FIG. 4B, a glass plate 232 is adhered onto a surface of the silicon wafer, on which a wiring layer is formed, via an adhesive layer 215. The glass plate 232 is shaped to have a diameter, which is the same as the silicon wafer 212 or 500-2000 µm larger than the silicon wafer 212; a thickness of 500-1000 µm; and have a good flatness. The adhesive layer 215 is preferably formed to have a thickness of 10-100 µm.

Figure 4C:
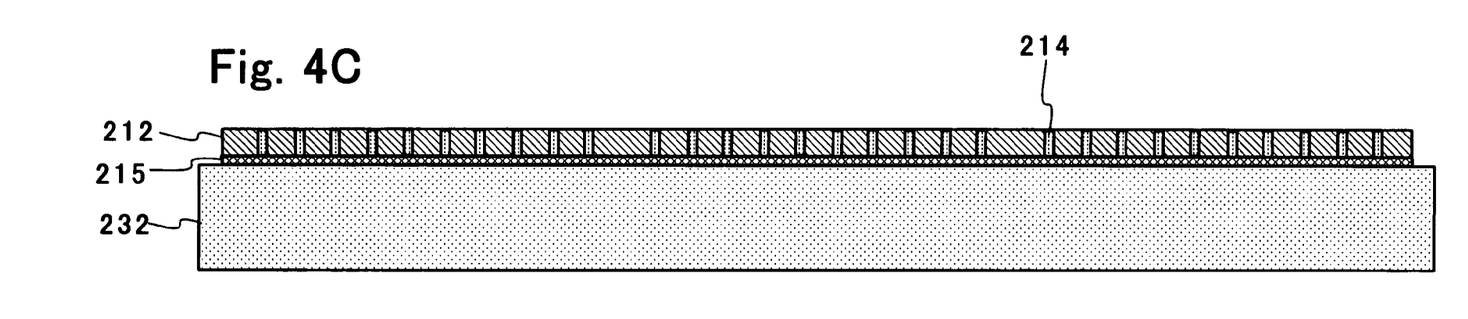
Figure 4D:
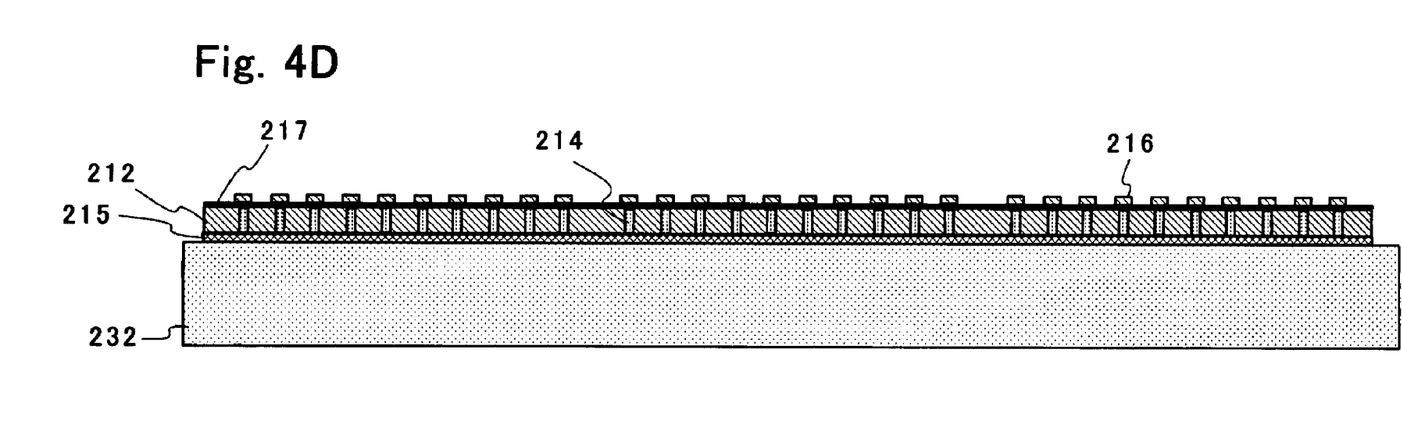

Next, as shown in FIG. 4C, a surface of the silicon wafer 212 is ground to make it thinner until ends of the through electrodes 214 are exposed. Subsequently, as shown in FIG. 4D, a rewiring pattern 217 and bumps 216 are formed on the silicon wafer 212. Further, an insulating layer is formed on a surface of the silicon wafer 212 excluding the through electrodes 214 and on the rewiring pattern 217. The silicon wafer 212 now has a thickness of 20-100 µm.

Figure 4E:
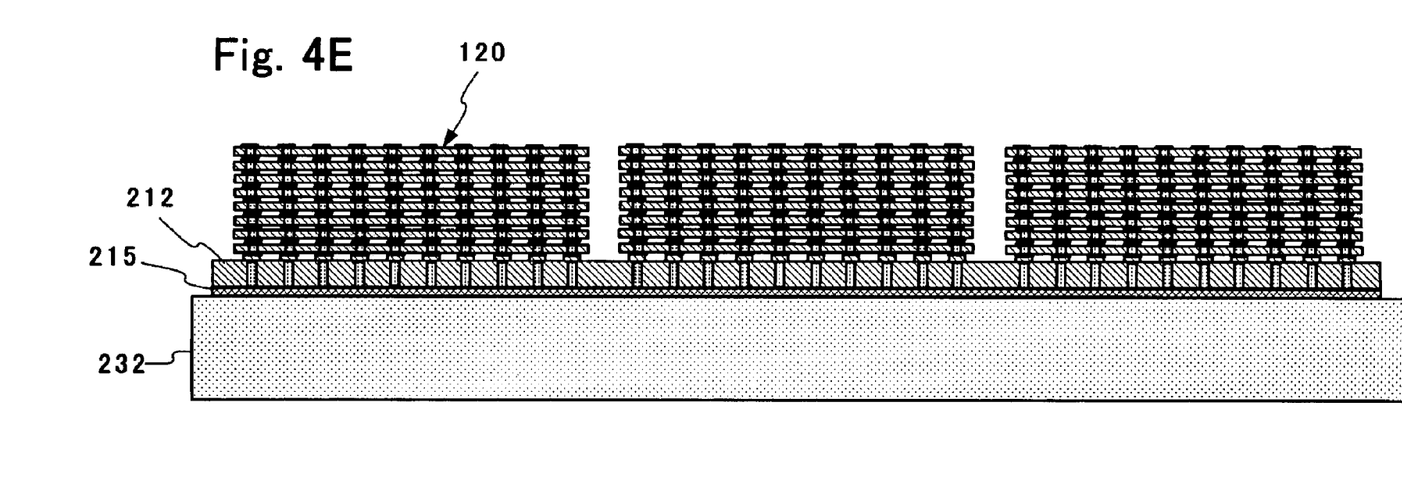

Next, as shown in FIG. 4E, semiconductor chips 100 are mounted at predetermined locations on the semiconductor wafer 212 to form a chip-layered structure 120. In the chip-layered structure 120, each of the semiconductor chips 100 is electrically connected to each other.

Figure 4F:
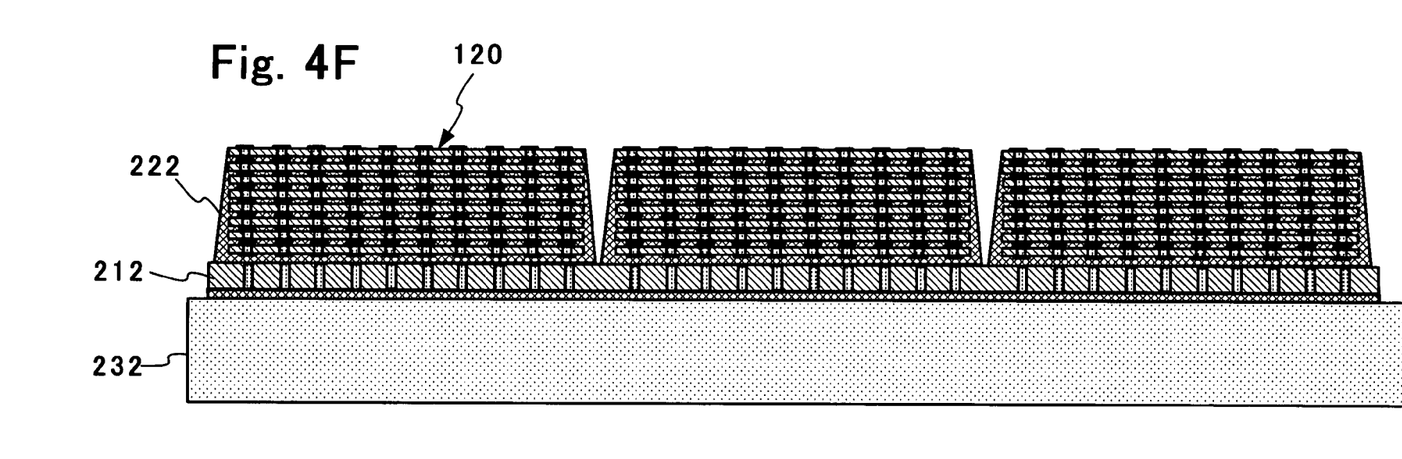

Next, as shown in FIG. 4F, an underfill resin 222 is injected from a side into the chip-layered structure 120, and is heated to be set. In another way, an underfill resin is provided at a predetermined area for chip mounting in advance before the semiconductor chip 100 is mounted. Such an underfill resin 222 is temporarily harden when mounting each of the semiconductor chips 100. In other words, the semiconductor chips 100 are layered one-by-one to have an underfill resin between next two chips 100. The underfill resin 222 may be of a thermosetting resin made from an epoxy material and silica (filler). In order to seal a narrow gap with the resin, a resin excluding a silica could be used.

Figure 4G:
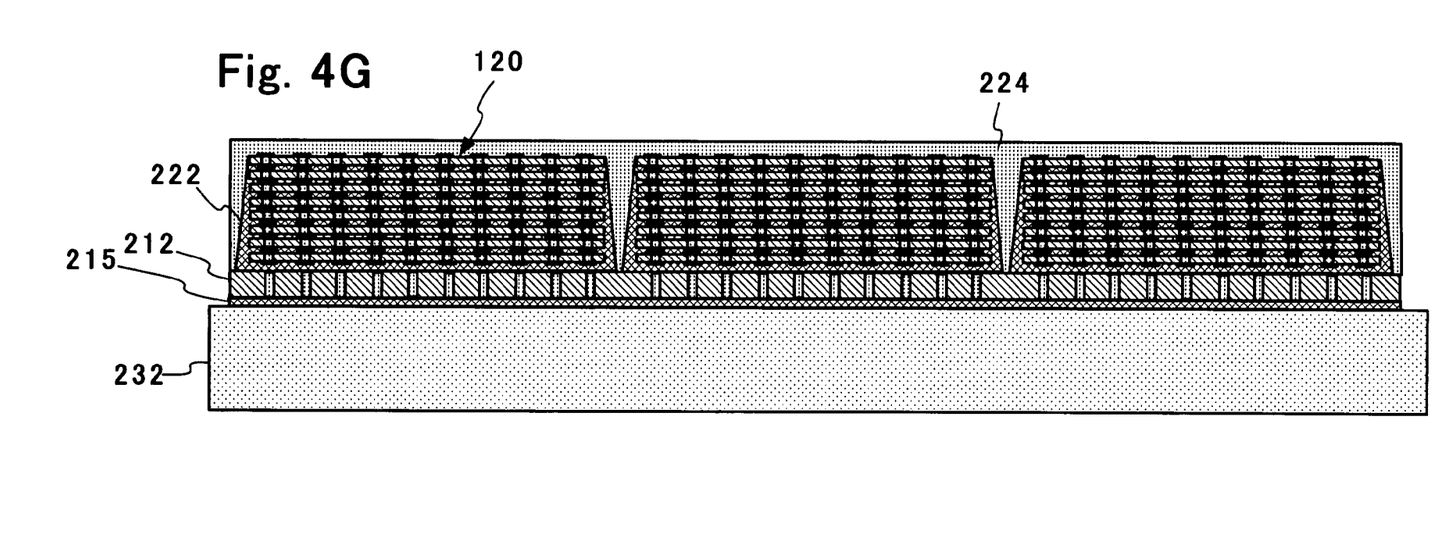

Next, as shown in FIG. 4G, a surface of the silicon wafer 212 is over-molded with a molding resin 224 entirely. Such an over-molding process is carried out by a transfer molding method using metal molds. The molding resin 224 may be made of an epoxy resin.

Figure 4H:
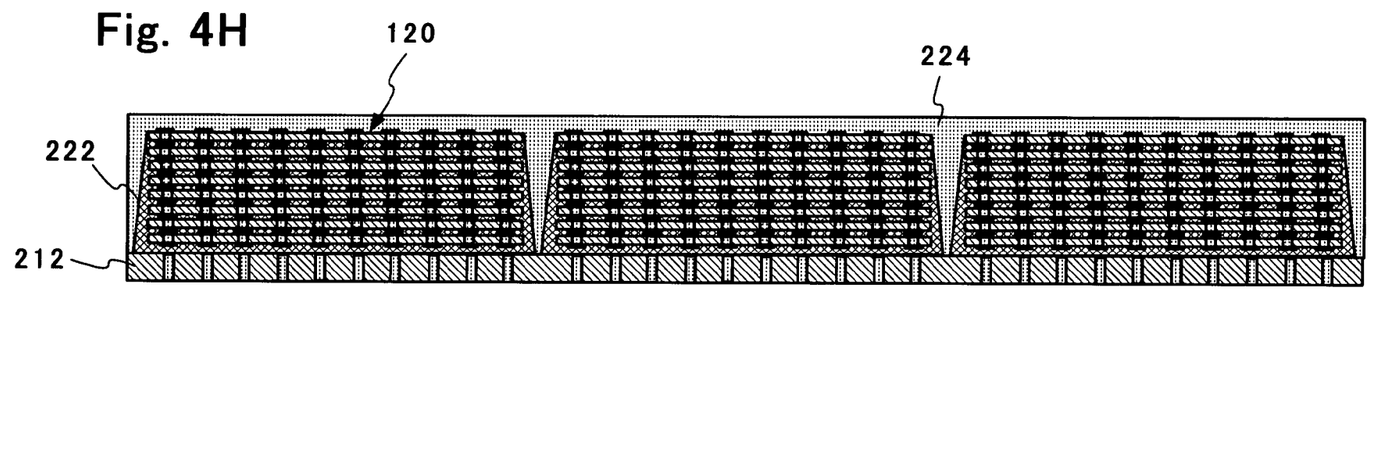
Figure 4I:
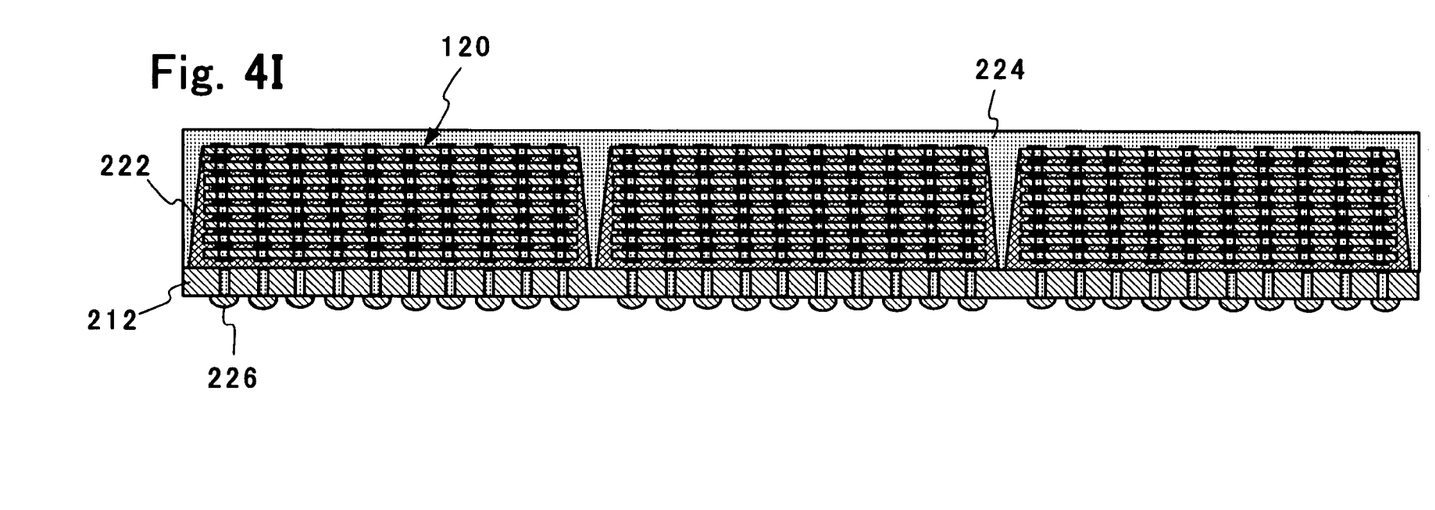

Next, as shown in FIG. 4H, the glass plate 232 and the adhesive layer 215 are removed from the silicon wafer 212. Subsequently, as shown in FIG. 4I, external terminals 226 are formed at predetermined locations on a rear surface of the silicon wafer 212. The external terminals 226 may be made of a material, for example, SnPb and SnAg. After that, the silicon wafer 212 is diced along dicing lines to form a plurality of individual semiconductor packages (BGA). The semiconductor package is mounted on a motherboard (circuit board).

As described above, according to the second preferred embodiment of this invention, semiconductor chips are mounted (layered) and resin-molded on a wafer state of semiconductor interposer, so that handling ability of the semiconductor interposer would be improved during fabrication processes. Further, the silicon wafer is shaped to be thinner after an over-molding process, so that the semiconductor interposer maintains a higher mechanical strength and defection due to lack of strength could be avoided.

In addition, rewiring layers can be formed both on the upper and lower surfaces of a silicon wafer, and therefore, the invention is applicable to a variety types of devices. Further, the silicon wafer is supported by a glass plate, the silicon wafer is prevented from being bended or curved before an over-molding process. Other types of support member may be used to support the silicon wafer in stead of a glass plate.

FIGS. 5A-5H are cross-sectional views showing fabricating steps of a semiconductor package according to a third preferred embodiment of this invention, each of which corresponds to a view taken on line A-A in FIG. 2. In FIGS. 5A-5I, the same or corresponding components those in FIGS. 3A-3F and FIGS. 4A-4I are represented by the same reference numerals and the same description is not repeated.

Figure 5A:
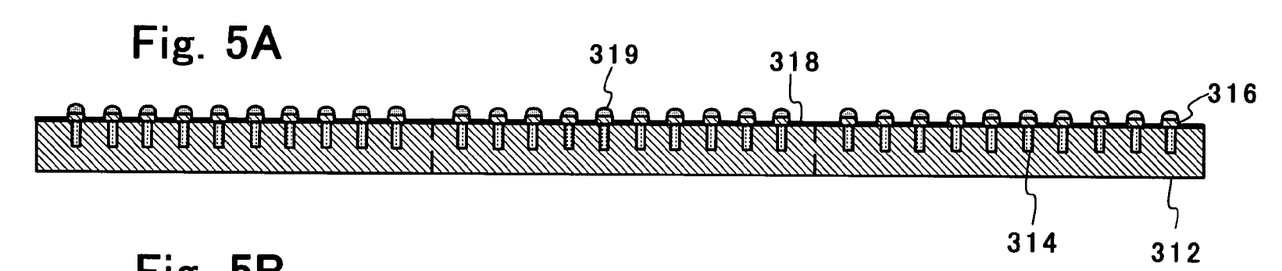
FIGS. 5A-5H are cross-sectional views showing fabricating steps of a semiconductor package according to a third preferred embodiment of this invention, each of which corresponds to a view taken on line A-A in FIG. 2.

Fist, as shown in FIG. 5A, a plurality of through electrodes 314 is formed in a silicon wafer 312 (W), which is used for a semiconductor interposer. The silicon wafer 312 has a thickness of 500-1000 µm. Upper ends of the through electrodes 314 are exposed from an upper surface of the silicon wafer 312. A rewiring layer 318, bump pads 316 and external terminals 319 are formed on the upper surface of the silicon wafer 312. An insulating layer, not shown, is formed over the rewiring layer 318 and the upper surface of the silicon wafer 312 except upper surfaces of the through electrodes 314. Each of the through electrodes 314 may be shaped to have a depth (length) of 20-100 µm.

The through electrodes 314 may be made of a material, for example, Cu, Al, W, Au, Ag and Poly-Si. The insulating layer may be made of a material, for example, SiO2, SiN and Polyimide.

Figure 5B:
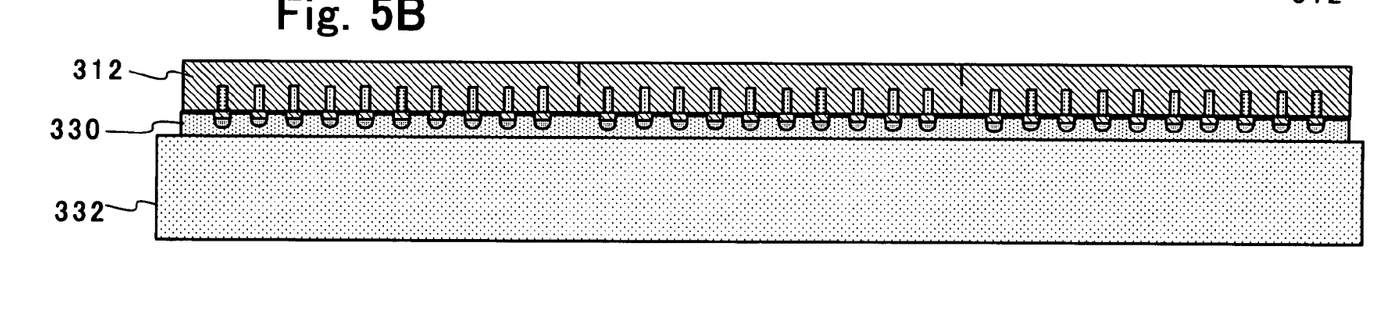

Next, as shown in FIG. 5B, a glass plate 332 is adhered onto a surface of the silicon wafer 312, on which the external terminals 319 are formed, via an adhesive layer 315. The glass plate 332 is shaped to have a diameter, which is the same as the silicon wafer 312 or 500-2000 µm larger than the silicon wafer 312; a thickness of 500-1000 µm; and have a good flatness. The adhesive layer 315 is preferably formed to have a thickness of 10-100 µm.

Figure 5C:
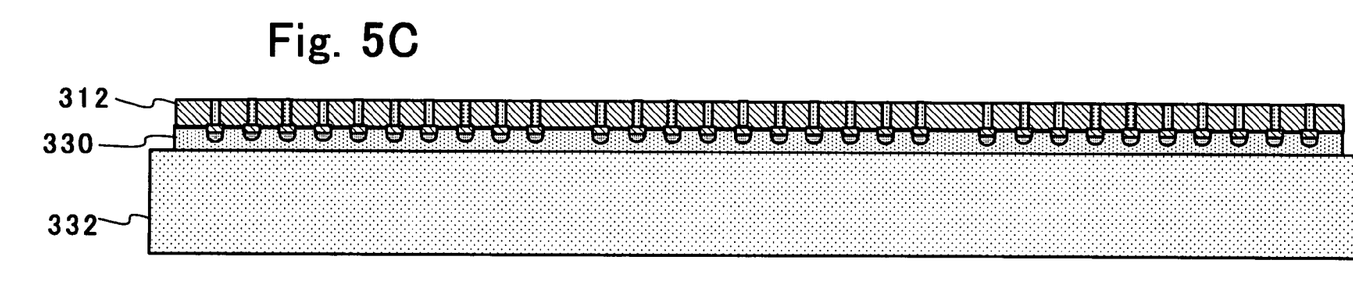
Figure 5D:
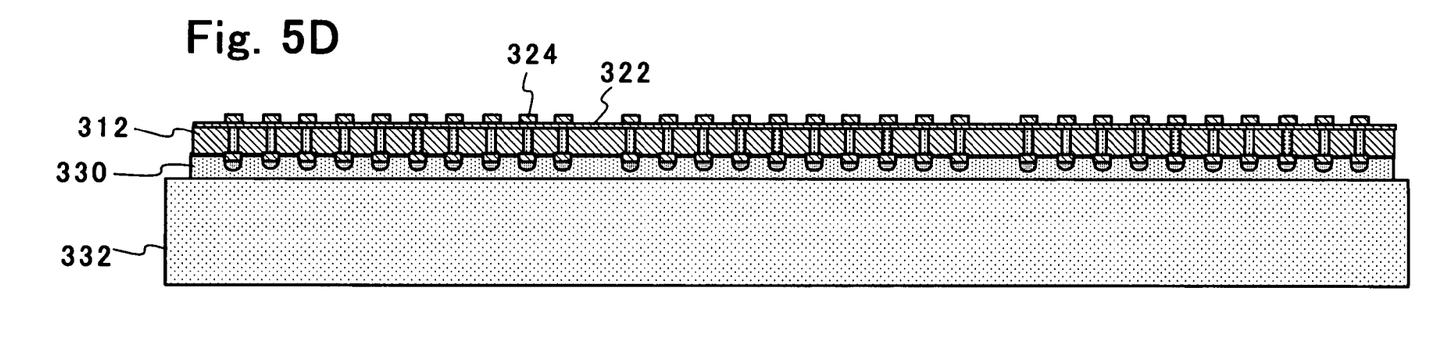

Next, as shown in FIG. 5C, a surface of the silicon wafer 312 is ground to make it thinner until ends of the through electrodes 314 are exposed. Subsequently, as shown in FIG. 5D, a rewiring pattern 322 and bumps 324 are formed on the silicon wafer 312. Further, an insulating layer is formed on a surface of the silicon wafer 312 excluding on the through electrodes 314 and on the rewiring pattern 322. The silicon wafer 312 now has a thickness of 20-100 µm.

Figure 5E:
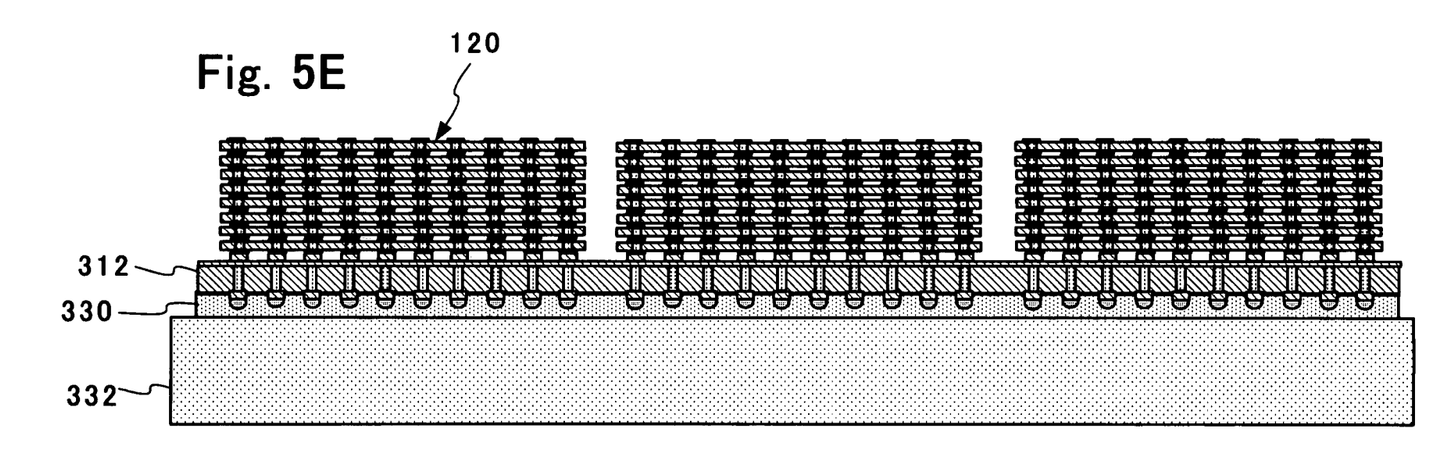

Next, as shown in FIG. 5E, semiconductor chips 100 are mounted at predetermined locations on the semiconductor wafer 312 to form a chip-layered structure 120. In the chip-layered structure 120, each of the semiconductor chips 100 is electrically connected to each other.

Figure 5F:
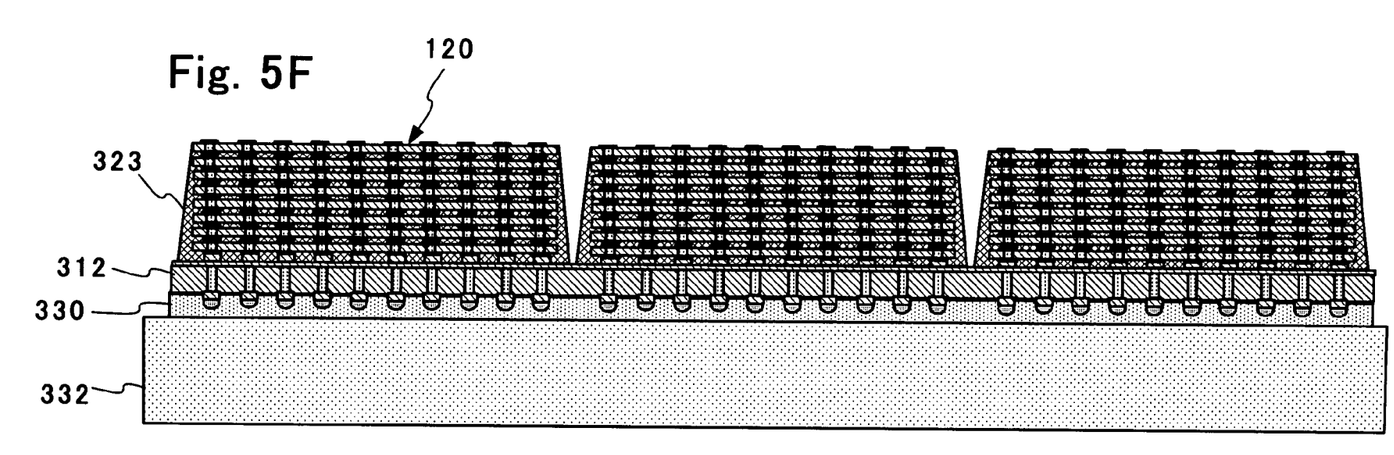

Next, as shown in FIG. 5F, an underfill resin 323 is injected from a side into the chip-layered structure 120, and is heated to be set. In another way, an underfill resin is provided at a predetermined area for chip mounting in advance before the semiconductor chip 100 is mounted. Such an underfill resin 323 is temporarily harden when mounting each of the semiconductor chips 100. In other words, the semiconductor chips 100 are layered one-by-one to have an underfill resin between next two chips 100. The underfill resin 323 may be of a thermosetting resin made from an epoxy material and silica (filler). In order to seal a narrow gap with the resin, a resin excluding a silica could be used.

Figure 5G:
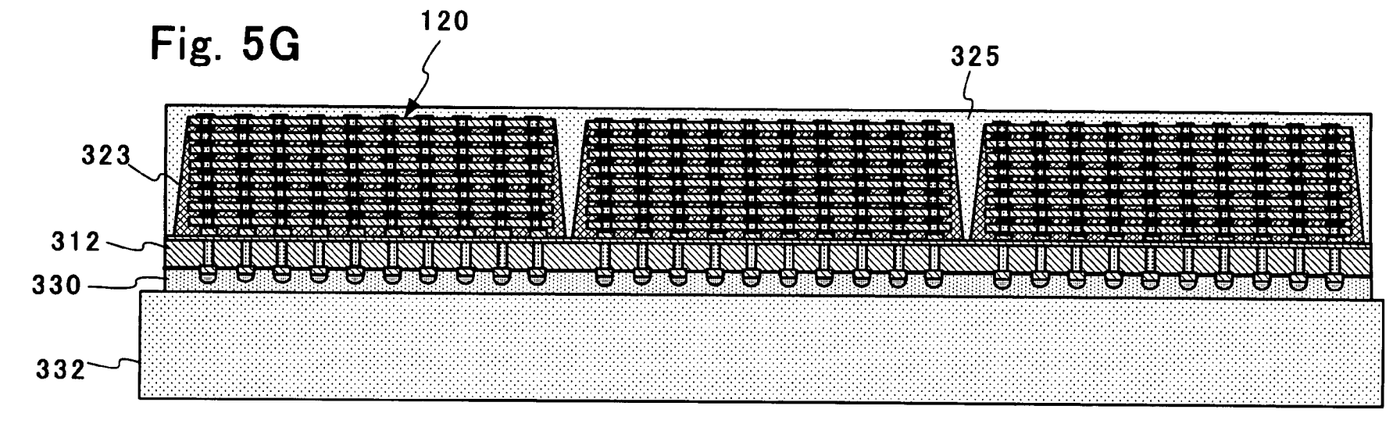

Next, as shown in FIG. 5G, a surface of the silicon wafer 312 is over-molded with a molding resin 325 entirely. Such an over-molding process is carried out by a transfer molding method using metal molds. The molding resin 325 may be made of an epoxy resin.

Figure 5H:
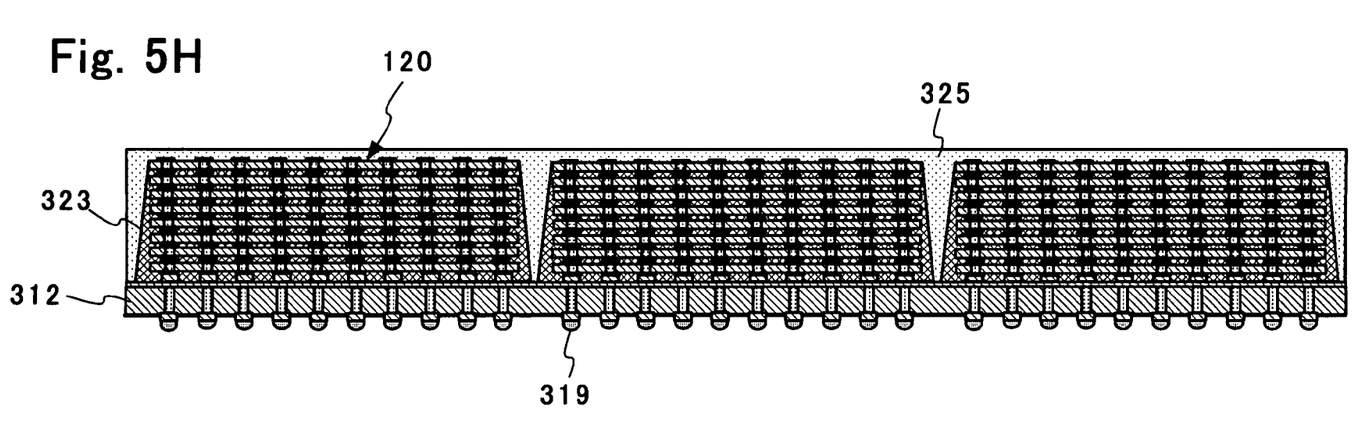

Next, as shown in FIG. 5H, the glass plate 332 and the adhesive layer 330 are removed from the silicon wafer 312. After that, the silicon wafer 312 is diced along dicing lines to form a plurality of individual semiconductor packages (BGA). The semiconductor package is mounted on a motherboard (circuit board).

As described above, according to the third preferred embodiment of this invention, semiconductor chips are mounted (layered) and resin-molded on a wafer state of semiconductor interposer, so that handling ability of the semiconductor interposer would be improved during fabrication processes. Further, the silicon wafer is shaped to be thinner after an over-molding process, so that the semiconductor interposer maintains a higher mechanical strength and defection due to lack of strength could be avoided.

Further, rewiring layers can be formed both on the upper and lower surfaces of a silicon wafer, and therefore, the invention is applicable to a variety types of devices. The silicon wafer is supported by a glass plate, the silicon wafer is prevented from being bended or curved before an over-molding process.

In addition, the external terminals 319 are formed before pads are contaminated with an adhesive, and therefore, reliability of connection between the interposer and the external terminals 319 is improved.

What is claimed is:

1. A method for fabricating a semiconductor package, in which a plurality of semiconductor chips having a through electrode is layered on a semiconductor interposer, comprising:

providing a support member onto a second surface of a semiconductor wafer until at least a resin molding step is complete:

mounting a plurality of semiconductor chips on a first surface of the semiconductor wafer, which is opposite to the second surface, the semiconductor wafer being used for a semiconductor interposer;

forming a mold resin over the semiconductor chips to cover the semiconductor chips entirely; and dicing the semiconductor wafer to form a plurality of individual semiconductor packages.

2. A method for fabricating a semiconductor package according to claim 1, wherein the support member is a glass plate.

3. A method for fabricating a semiconductor package according to claim 1, further comprising:

removing the support member after the resin molding step; and forming external terminals on the second surface of the semiconductor wafer.

4. A method for fabricating a semiconductor package according to claim 1, further comprising:

forming external terminals on the second surface of the semiconductor wafer before providing the support member onto the second surface.

5. A method for fabricating a semiconductor package according to claim 1, further comprising:

grinding the first surface of the semiconductor wafer after the support member is provided to the second surface; and mounting the semiconductor chips on the first surface of the semiconductor wafer, which has been ground.

6. A method for fabricating a semiconductor package according to claim 1, further comprising:

forming a rewiring layer on the first surface before the semiconductor chips are mounted on the semiconductor wafer.

* * * * *